(12) United States Patent
Berendez

(10) Patent No.: US 9,276,523 B1
(45) Date of Patent: Mar. 1, 2016

(54) PANEL WASHING SYSTEMS AND METHODS

(71) Applicant: Cory Berendez, Austin, TX (US)

(72) Inventor: Cory Berendez, Austin, TX (US)

( * ) Notice: Subject to any disclaimer, the term of this patent is extended or adjusted under 35 U.S.C. 154(b) by 0 days.

(21) Appl. No.: 14/692,222

(22) Filed: Apr. 21, 2015

Related U.S. Application Data

(60) Provisional application No. 62/109,102, filed on Jan. 29, 2015.

(51) Int. Cl.
| | |
|---|---|
| *A47L 11/38* | (2006.01) |
| *B08B 1/00* | (2006.01) |
| *B08B 3/00* | (2006.01) |
| *H01L 31/042* | (2014.01) |
| *H02S 40/10* | (2014.01) |
| *F24J 2/46* | (2006.01) |
| *B08B 3/02* | (2006.01) |

(52) U.S. Cl.
CPC ............ *H02S 40/10* (2014.12); *B08B 1/006* (2013.01); *B08B 1/008* (2013.01); *B08B 3/024* (2013.01); *F24J 2/461* (2013.01); *H01L 31/042* (2013.01)

(58) Field of Classification Search
CPC ........ B08B 1/008; B08B 1/002; B08B 1/006; B08B 3/024; F24J 2/461; E04G 23/00; E04G 23/002; B60S 1/02; H01L 31/042; H02S 40/10
USPC ................... 15/250.01, 250.001, 250.11, 103
See application file for complete search history.

(56) References Cited

U.S. PATENT DOCUMENTS

| | | | |
|---|---|---|---|
| 3,641,607 A | | 2/1972 | Lemelson |
| 5,323,508 A | * | 6/1994 | Sheldrake ................. A47L 1/02 15/103 |
| 6,986,186 B1 | | 1/2006 | Dube |
| 7,174,678 B2 | | 2/2007 | Gallant |
| 7,231,683 B1 | | 6/2007 | Cruz |
| 7,503,091 B2 | | 3/2009 | White, Jr. et al. |
| 8,695,152 B2 | | 4/2014 | Lemchen |
| 8,771,432 B2 | | 7/2014 | Meller et al. |
| 2006/0048800 A1 | | 3/2006 | Rast et al. |
| 2009/0266353 A1 | | 10/2009 | Lee |
| 2013/0081652 A1 | | 4/2013 | Falk |

FOREIGN PATENT DOCUMENTS

| | | |
|---|---|---|
| EP | 0505956 | 9/1992 |
| WO | WO2014/168597 A1 * | 10/2014 |

* cited by examiner

*Primary Examiner* — Gary Graham
(74) *Attorney, Agent, or Firm* — Pierson IP, PLLC

(57) ABSTRACT

Embodiments disclose automated systems and methods for washing solar panels. The solar panels may be arranged in rows with varying lengths. A washing device unit may be configured to clean a first row, and a second washing may be configured to clean a second row, wherein the first row may include more solar panels than the first row. The first washing device may be configured to receive cleaning fluid from a fluid source and supply the cleaning fluid to the second washing device in areas that the second row is adjacent to the first row.

20 Claims, 11 Drawing Sheets

PANEL WASHING SYSTEMS AND METHODS

CROSS-REFERENCE TO RELATED APPLICATIONS

This application claims a benefit of priority under 35 U.S.C. §119 to Provisional Application No. 62/109,102 filed on Jan. 29, 2015, which is fully incorporated herein by reference in its entirety.

BACKGROUND INFORMATION

1. Field of the Disclosure

Examples of the present disclosure are related to systems and methods for washing panels with a plurality of washing devices. More particularly, embodiments relate to washing adjacent panels utilizing a single fluid line, wherein the fluid line is configured to supply fluid to each of the washing devices based on the alignment of the washing devices.

2. Background

Solar panels use light energy from the sun to generate electricity through a photovoltaic effect. Depending on the construction, solar panels can produce electricity from different frequencies of light. Electrical connections are coupled to the solar panels to achieve a desired output voltage and current capacity.

In recent years, mounting solar panels on roofs has become prevalent. These mounted solar panels are conventionally held in place by racks and/or frames attached to mounting supports. The mounting supports include mounts that are directly attached to the roof structure, footing mounts, and wiring connections. The footing mounts are comrpised of aluminum and other metals that use weight to secure the solar panels in position. Furthermore, conventionally the mounted solar panels are mounted at an angle to maximize the reception of sunlight.

Due to the positioning of the mounted solar panels in combination with weathering effects require that the solar panels are frequently cleaned. This is because even a thin coating of dust or dirt affects the photovoltaic energy produced by the solar panels.

Conventionally to clean the solar panels, mechanical devices such as cranes are used. Alternatively, users must utilize safety devices, such as harnesses, to manually clean the solar panels. Accordingly, cleaning solar panels mounted on roofs or buildings is an arduous task. Furthermore, conventional systems and methods for cleaning solar panels do not conserve fluids.

Accordingly, needs exist for more effective and efficient systems and methods for cleaning solar panels utilizing a single fluid line, wherein the fluid line is configured to supply fluid to a plurality of washing devices.

SUMMARY

Embodiments disclosed herein describe systems and methods for cleaning solar panels. Embodiments may include a plurality of modular based washing devices that are positioned adjacent to each other, wherein a single fluid line may be configured to supply fluid to each of the washing devices. Utilizing embodiments, fluid may be conserved by only requiring a single fluid line, wherein the fluid line supplies a necessary amount of fluids based on the number of aligned and coupled washing devices. Additionally, using embodiments, time and/or resources required to clean the solar panels may be reduced.

The solar panels may be arranged in rows with varying lengths, wherein each of the rows may include a separate washing device, wherein the washing devices are configured to couple together to simultaneously clean the rows of solar panels. A first washing device may be configured to clean a first row, and a second washing may be configured to clean a second row, wherein the first row may include more solar panels than the first row. The first washing device may be configured to receive cleaning fluid from a fluid source, and the first washing device may be configured to supply the cleaning fluid to the second washing device.

Embodiments may include a plurality of rows of solar panels, a plurality of rails, washing devices, an energy chain, a fluid hose, and water feed tubes.

The solar panels may be configured to use light energy from the sun to generate electricity through the photovoltaic effect. The solar panels may use wafer-based crystalline silicon cells, thin-film cells based on cadmium telluride or silicon, etc. Electrical connections may be coupled to the solar panels to achieve a desired output voltage and/or current capacity. The solar panels may be arranged in rows, wherein the rows are positioned adjacent to each other and share a common side. The rows of solar panels may have different lengths and varying amounts of solar panels. Accordingly, a first row of solar panels may have more solar panels than a second row of solar panels, and the second row of solar panels may have more solar panels than a third row of solar panels.

Positioned on the each side of a row of solar panels may be a rail. The rails may be linear motion baring or linear slides configured to allow the washing devices to move in a linear direction.

The washing devices may be positioned between two rails, such that each row of solar panels may include a washing device. The washing device associated with a row may extend across the entire width of the row of solar panels. The washing device may include a squeegee, brush, blade, etc. that is configured to remove dust, dirt, debris, etc. from an upper surface of a solar panel.

The washing devices may be configured to be dynamically coupled together when the washing devices are aligned. When the washing devices are aligned, each of the washing devices may be configured to receive fluid from the same fluid hose. Responsive to certain washing devices becoming misaligned, aligned washing devices may not disconnect from each other and may remain in locked position. However, the misaligned washing device may automatically become decoupled from the aligned washing devices.

The energy chain may be a pulley system, drive shaft, etc. or any other device that is configured to move along a first side of the washing system. In embodiments, the energy chain may be configured to move along a linear path. The energy chain may be configured to move each of the washing devices, wherein the energy chain may be permanently coupled to a first washing device. Responsive to the first washing device and a second washing device being coupled to one another, the energy chain may move the first washing device and the second washing device. Accordingly, when the first washing device is coupled to the second washing device, the second washing device may move dependently based on the first washing device. Responsive to the first washing device and the second washing device being misaligned and decoupled, the energy chain may only move the first washing device.

The fluid hose may be a flexible hollow tube configured to carry fluids from a first location to a second location. In embodiments, the fluid hose may be a pipe, shaft, or any other type of fluid. The fluid hose may include an inlet port and an outlet port. The inlet port may be configured to be coupled to an external fluid source, and the outlet port may be configured to be coupled to the first washing device.

Each of the washing devices may include a water feed tube that is configured to transport the fluid across the width of the solar panel. In embodiments, a first water feed tube associated with the first row of solar panels may receive fluid from the fluid source. In embodiments, each of the water feed tubes may be vertically offset at the same distance from the solar panels. Accordingly, the water feed tubes may be configured to align with each other.

Responsive to the first washing device being aligned and coupled with the second washing device, the first water feed tube may interface with a second water feed tube associated with the second row of solar panels. When the second water feed tube is coupled with the water feed tube, the second water feed tube may displace fluid across a width of the second row of solar panels. Responsive to decoupling the second water feed tube from the first water feed tube, the first water feed tube may not supply fluid to the second water feed tube. However, the first feed tube may still disperse liquid across the first row of solar panels when the first water feed tube and the second water feed tube are decoupled.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
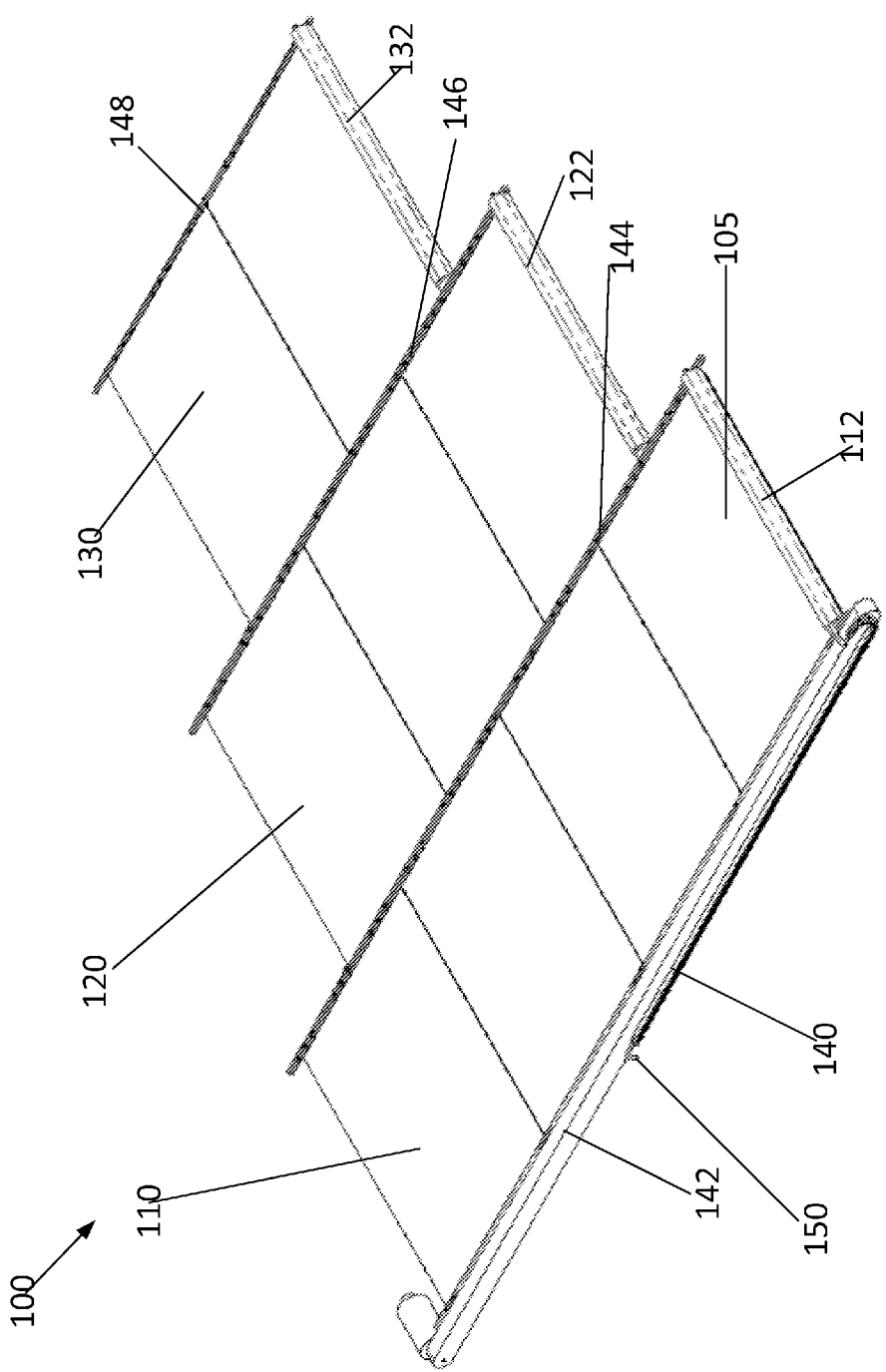
FIG. 1 depicts a system for cleaning solar panels, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Embodiments disclose automated systems and methods for washing panels, such as window panels, solar panels, glass panels, etc. (referred to hereinafter collectively and individually as "solar panels").

FIG. 1 depicts a system 100 for cleaning solar panels. System 100 may be a modular system, wherein rows of solar panels may be dynamically added and automatically cleaned utilizing a single fluid source. System 100 may include solar panels 105, a first row of solar panels 110, second row of solar panels 120, third row of solar panels 130, energy chain 140, first rail 144, second rail 146, first washing device 112, second washing device 122, third washing device 132, and fluid hose 150.

Solar panels 105 may be configured to use light energy from the sun to generate electricity through the photovoltaic effect. Solar panels 105 may use wafer-based crystalline silicon cells, thin-film cells based on cadmium telluride or silicon, etc. Electrical connections may be coupled to solar panels 105 to achieve a desired output voltage and/or current capacity.

Solar panels 105 may be arranged in rows 110, 120, 130, wherein the rows 110, 120, 130 are positioned adjacent to each other. Additionally, two adjacent rows may share a common side. The rows of solar panels 110, 120, 130 may have different lengths with varying amounts of solar panels. The rows of solar panels 110, 120, 130 may have different lengths to correspond to different geometries of buildings, roofs, etc.

For example, a first row 110 of solar panels 105 may include four solar panels 105, a second row 120 of solar panels 105 may include three solar panels 105, and a third row 130 of solar panels 105 may include two solar panels 105. Accordingly, first row 110 of solar panels 105 may have more solar panels 105 than second row 120 of solar panels 105, and the second row 120 may have more solar panels 105 than third row 130 of solar panels 105. Furthermore, each of the rows 110, 120, 130 of solar panels 105 may be aligned in parallel. However, the ends of rows 110, 120, 130 of solar panels 105 may be misaligned.

Energy chain 140 may be a pulley system, drive shaft, etc. or any other device that is configured to move along a first side 142 of the washing system 100. In embodiments, energy chain 140 may be configured to move along a linear path along the first side 142. Energy chain 140 may be configured to move each of the washing devices 112, 122, 132. In embodiments, energy chain 140 may be directly coupled to first washing device 122. Responsive to energy chain 140 moving along the linear path, first washing device 122 may also move along the liner path.

First rail 144 may be linear motion baring or linear slides configured to allow first washing device 112 to move in a linear direction. First rail 144 may be positioned on a second side of the first row 110 of solar panels 105, wherein first rail 144 is positioned between first row 110 and second row 120 of solar panels. First rail 144 may extend across a length of first row 110, and extend past a length of second row 120.

First washing device 112 may be a device configured to wash, clean, etc. an upper surface of solar panels 105. First washing device 112 may include fluid dispensers and squeegee, brush, blade, etc. Responsive to fluid being positioned on an upper surface of solar panels 105, first washing device 112 may remove dust, dirt, debris, etc. from the upper surface of solar panel 105. First washing device 112 may extend across an entire width of first row 110 of solar panels 105, wherein first washing device 112 may be coupled to first side 140 and first rail 144. In embodiments, when first washing device 112 is not in use, first washing device 112 may be positioned at an end of first row 110.

Second rail 146 may be linear motion baring or linear slides configured to allow second washing device 122 to move in a linear direction. Second rail 146 may be positioned on a second side of the second row 120 of solar panels 105, wherein second rail 146 is positioned between second row 120 and third row 130 of solar panels. Second rail 146 may extend across a length of second row 120, and extend past a length of third row 130.

Second washing device 122 may be a device configured to wash, clean, etc. an upper surface of solar panels 105. Responsive to fluid being positioned on an upper surface of solar panels 105, second washing device 122 may remove dust, dirt, debris, etc. from the upper surface of solar panel 105. In embodiments, second washing device 122 may extend across an entire width of second row 120 of solar panels 105, wherein second washing device 122 may be coupled to first rail 144 and second rail 146. In embodiments, when second washing device 122 is not in use, second washing device 122 may be positioned at an end of second row 120.

Third rail 148 may be linear motion baring or linear slides configured to allow third washing device 132 to move in a linear direction. Third rail may be positioned on a second side of third row 130 of solar panels 105. Third rail 148 may extend across a length of third row 130.

Third washing device 132 may be a device configured to wash, clean, etc. an upper surface of solar panels 105. Responsive to fluid being positioned on an upper surface of solar panels 105, third washing device 132 may remove dust, dirt, debris, etc. from the upper surface of solar panel 105. In embodiments, third washing device 132 may extend across an entire width of third row 130 of solar panels 105, wherein third washing device 132 may be coupled to second rail 146 and third rail 148. In embodiments, when third washing device 132 is not in use, third washing device 132 may be positioned at an end of third row 130.

Fluid hose 150 may be a flexible hollow tube configured to carry fluids from a first location to a second location. Fluid hose 150 may be a pipe, shaft, or any other type of tube configured to transport fluid. Fluid hose 150 may include an inlet port and an outlet port. The inlet port may be configured to be coupled to an external fluid source, and the outlet port may be configured to be coupled to first washing device 112. Fluid hose 150 may be configured to simultaneously deliver fluid to first washing device 112, second washing device 122, and third washing device 132 when the washing devices are aligned. Responsive to the washing devices being misaligned, fluid hose 150 may only deliver fluid to first washing device 112 and/or second washing device 122.

Figure 2:
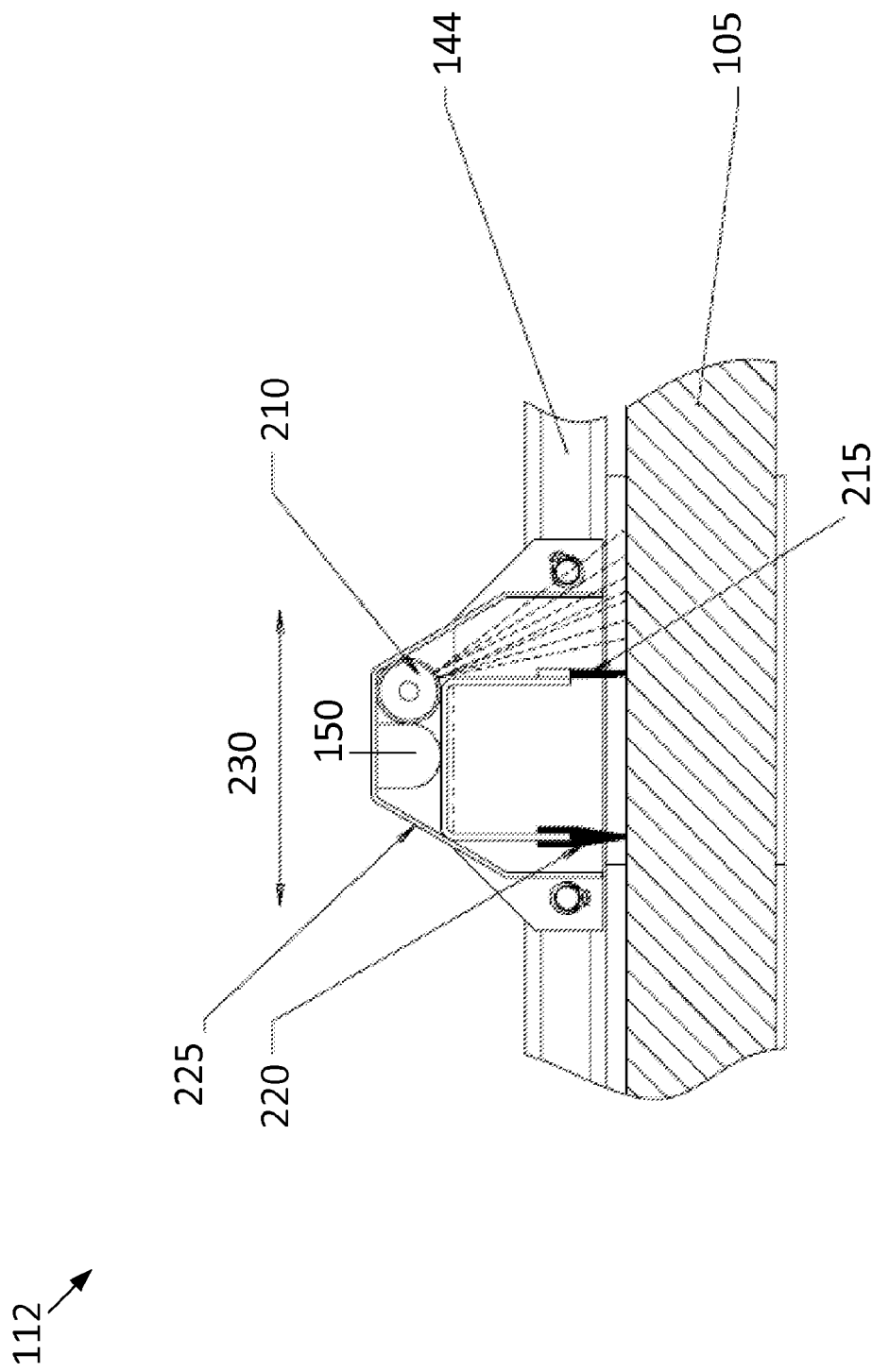
FIG. 2 depicts a side view of first washing device, according to an embodiment.

FIG. 2 depicts a side view of first washing device 112. First washing device 112 may include a water feed tube 210, brush 215, wiper 220, and cover 225, wherein first washing device 112 may be configured to travel in linear directions 230.

Water feed tube 210 may be configured to extend across the entire width of first washing device 112. Water feed tube 210 may receive fluid from a fluid hose and transfer fluid to a second washing device when the first washing device 112 is aligned with the second washing device. Water feed tube 210 may be vertically offset from a surface of solar panels. Furthermore, water feed tube 210 may be configured to dispense fluid along an upper surface of solar panel 105. Water feed tube 210 may dispense the fluid in front of brush 215 and wiper 220 with respect to the linear movement of first washing device 112. More specifically, when first washing device 112 is moving in a first direction, then water feed tube 210 may dispense fluid in the first direction. When first washing device 112 is moving in a second direction, water feed tube 210 may dispense fluid in the second direction.

Brush 215 may be a rotating tool with bristles, wire, filaments, etc. configured to remove debris from the upper surface of solar panel 105. If debris is positioned on the upper surface of solar panel 105, brush 215 may contact the debris and push the debris off the surface of solar panel 105. Brush 215 may be positioned between water feed tube 210 and a surface of solar panel 105.

Wiper 220 may be a device configured to remove the dispensed fluid and/or debris from the upper surface of solar panel 105. Wiper 220 may be positioned such that a tip of wiper 220 is positioned adjacent to the upper surface of solar panel 105. Wiper 220 may be comprised of a semi-flexible material such as rubber, plastics, etc. In embodiments, wiper 220 may be horizontally offset from water feed tube 210 and brush 215.

Cover 225 may be a lid, cap, housing, etc. configured to house the components of first washing device 112. Cover 225 may also be configured to protect the components of washing device 112 from sunlight, debris falling on the components, rust, etc.

Figure 3:
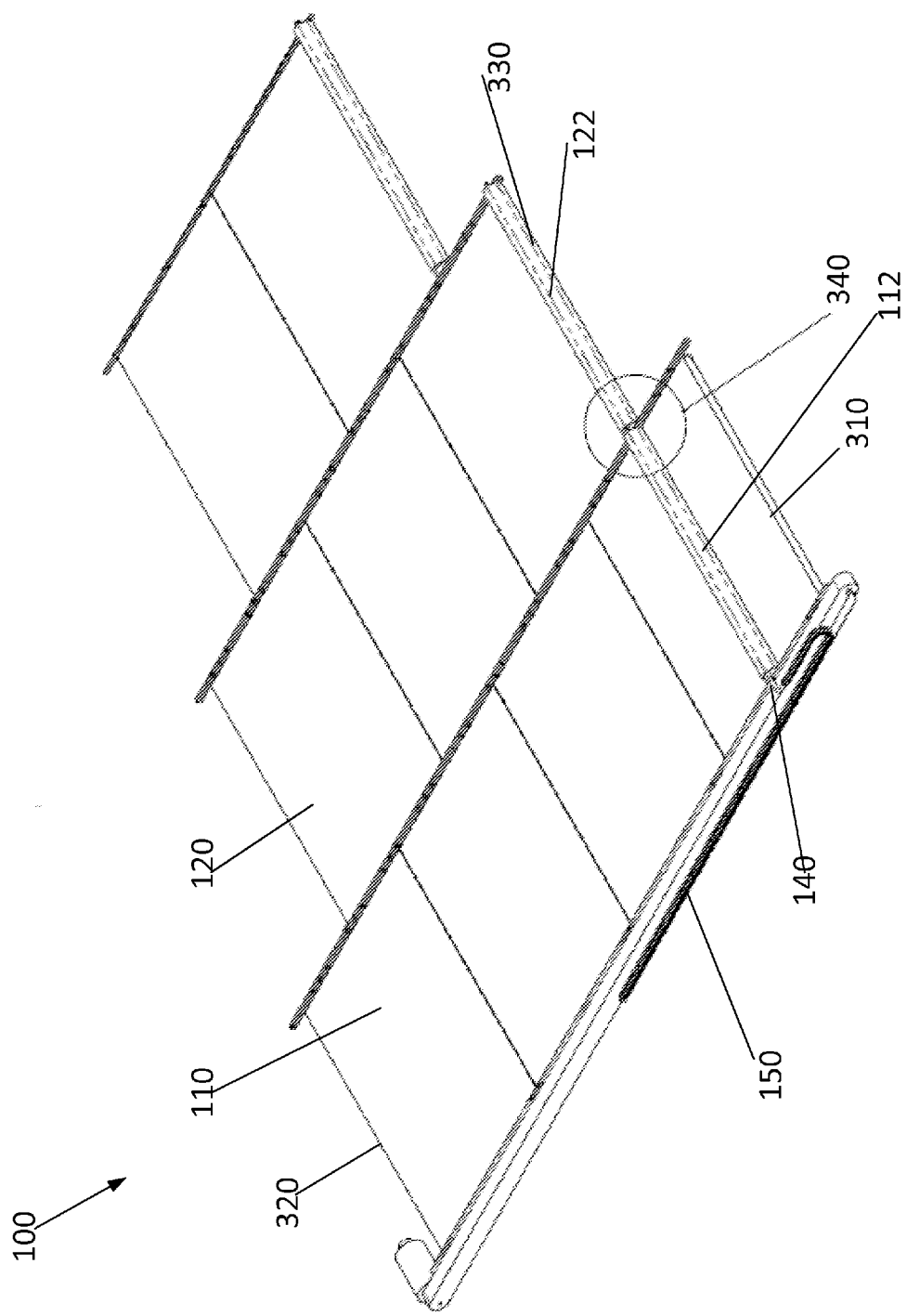
FIG. 3 depicts an embodiment of a washing system, according to an embodiment.

FIG. 3 depicts an embodiment of washing system 100, wherein first washing device 112 is moved to align with second washing device 122.

As depicted in FIG. 2, energy chain 140 may be configured to move first washing device 112 along a linear path from a first end 310 towards a second end 320 of first row 110 of solar panels 105. Furthermore, second washing device 122 may be secured at a fixed position at a first end 330 of second row 120 of solar panels 105.

Second washing device 122 may be fixed at the first end 330 of second row via a locking mechanism 340. The locking mechanism 340 may be configured to secure second washing device 122 in the fixed location. Locking mechanism 340 may secure second washing device 122 when second washing device 122 is not coupled with first washing device 112. Alternatively, the locking mechanism 340 may be configured to allow second washing device 122 to move in the linear direction when first washing device 112 is aligned and coupled with second washing device 122. Accordingly, locking mechanism 340 may be configured to dynamically lock and unlock second washing device 122 based on the positioning of first washing device 112 and second washing device 122.

While second washing device 122 is in a fixed position at the first end 330 of second row 120, first washing device 112 may move along a linear path to become aligned with second washing device 122. Responsive to the alignment of first washing device 112 and second washing device 122, an actuator may move a connection shaft to couple a first water feed tube associated with first washing device 112 with a second water feed tube associated with second washing device 122. In embodiments, the connection shaft may be configured to move in a direction that is perpendicular to the direction of first row of solar panels 110.

The connection shaft may have a diameter that is smaller than the first water feed tube. When first washing device 112 and second washing device 122 are decoupled, at least a portion of the connection shaft may be housed within the first water feed tube. When the actuator moves the connection shaft a first portion of connection shaft may be positioned within the first water feed tube and a second portion of connection shaft may be positioned within the second water feed tube. Responsive to coupling the first washing device 112 and second washing device 122, locking mechanism 340 may automatically release second washing device 122, which may allow second washing device 122 to travel along the linear path. Accordingly, locking mechanism 340 may be configured to secure second washing device 122 in place until the connection shaft is inserted within first water feed tube and second water feed tube.

Figure 4:
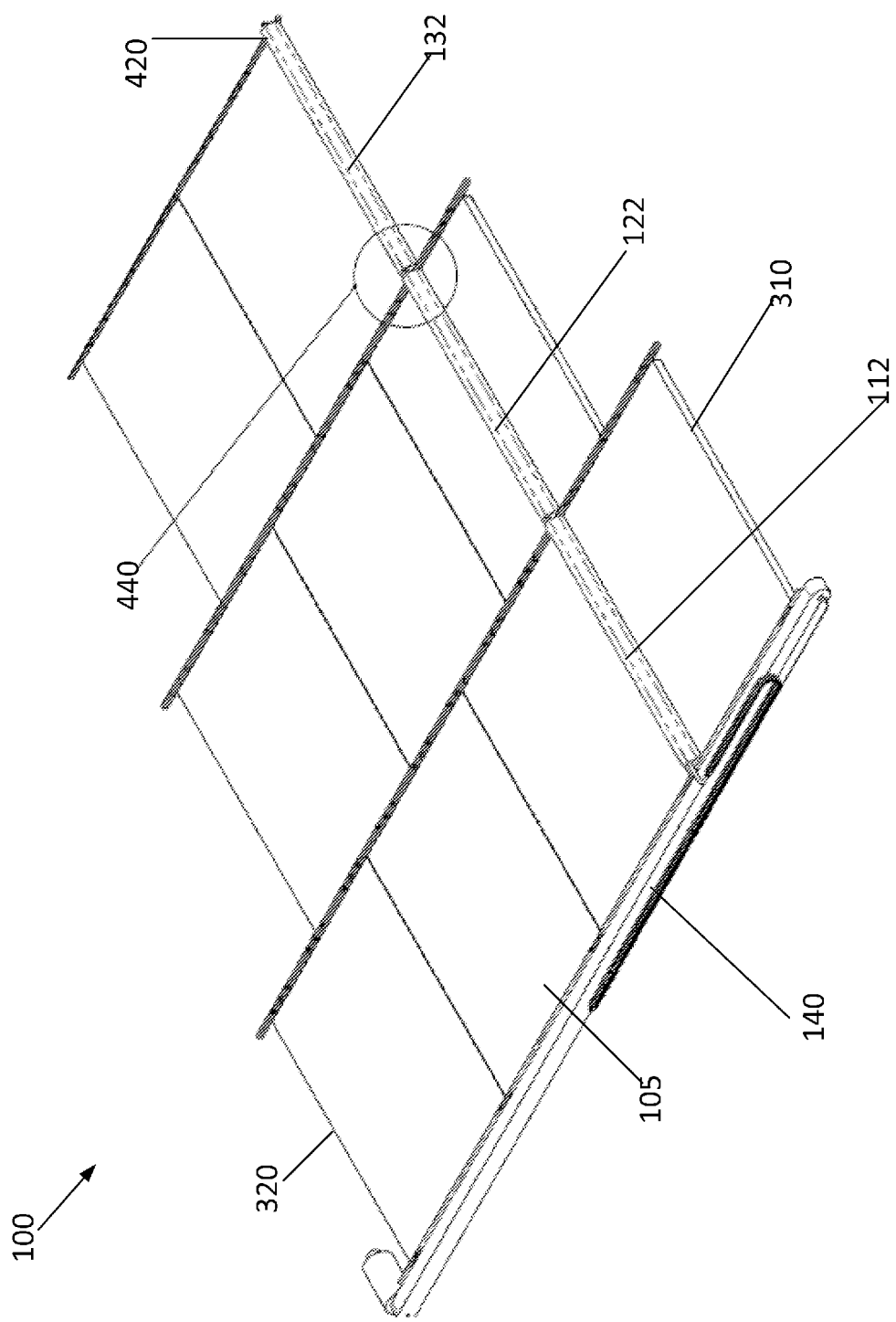
FIG. 4 depicts an embodiment of a washing system, according to an embodiment.

FIG. 4 depicts an embodiment of washing system 100, wherein first washing device 112 and second washing device 122 are moved to align with third washing device 132. In embodiments, third washing device 132 may couple with second washing device 122 in a similar fashion as second washing device 122 couples with first washing device 112. Therefore, for the sake of brevity another description of these processes and elements is omitted.

As depicted in FIG. 4, energy chain 140 may move first washing device 112 and second washing device 122 in a linear path, wherein the linear path may be from first side 310 towards second side 320. The fluid from a fluid hose may be displaced on solar panels 105 on the first and second rows of solar panels. The fluid may be transported from the fluid hose to first washing device 112, and to second washing device 122 via the first connection shaft between first washing device 112 and second washing device 122. Accordingly, by coupling the first water feed tube and the second water feed tube, multiple washing devices may automatically share fluid from the same fluid source. Furthermore, to limit the loss of fluid, the fluid may travel in a linear path that is perpendicular to the direction of first row of solar panels 110. However, the length of the liner path may be based on the placement of the washing devices 112, 122, 132.

Third washing device 132 may be fixed at the first end 420 of the third row of solar panels via a locking mechanism 440, wherein the locking mechanism 440 is utilized to secure third washing device 132 in place.

The locking mechanism 440 may be configured to secure third washing device 132 in a fixed location. Locking mechanism 440 may secure third washing device when second washing device 122 is not coupled with first washing device 112 and second washing device 122. Alternatively, the locking mechanism 440 may be configured to allow third washing device 132 to move in the linear direction when first washing device 112 and second washing device 122 are aligned and coupled with third washing device 132.

While third washing device 132 is in the fixed position at the first end 420 of third row 130, first washing device 112 and second washing device 122 may move along a linear motion to become aligned with second washing device. Responsive to the alignment of first washing device 112, second washing device 122, and third washing device 132, an actuator may move a second connection shaft to couple the second water feed tube associated with second washing device 122 with a third water feed tube associated with third washing device 132.

In embodiments, the second connection shaft may have a diameter that is smaller than the second water feed tube. When second washing device 122 and third washing device 132 are decoupled, at least a portion of the connection shaft may be housed within the second water feed tube. Responsive to aligning first washing device 112, second washing device 122, and third washing device 132, the actuator may move the second connection shaft such that a first portion of connection shaft is within the second water feed tube and a second portion of connection shaft is within the third water feed tube.

Figure 5:
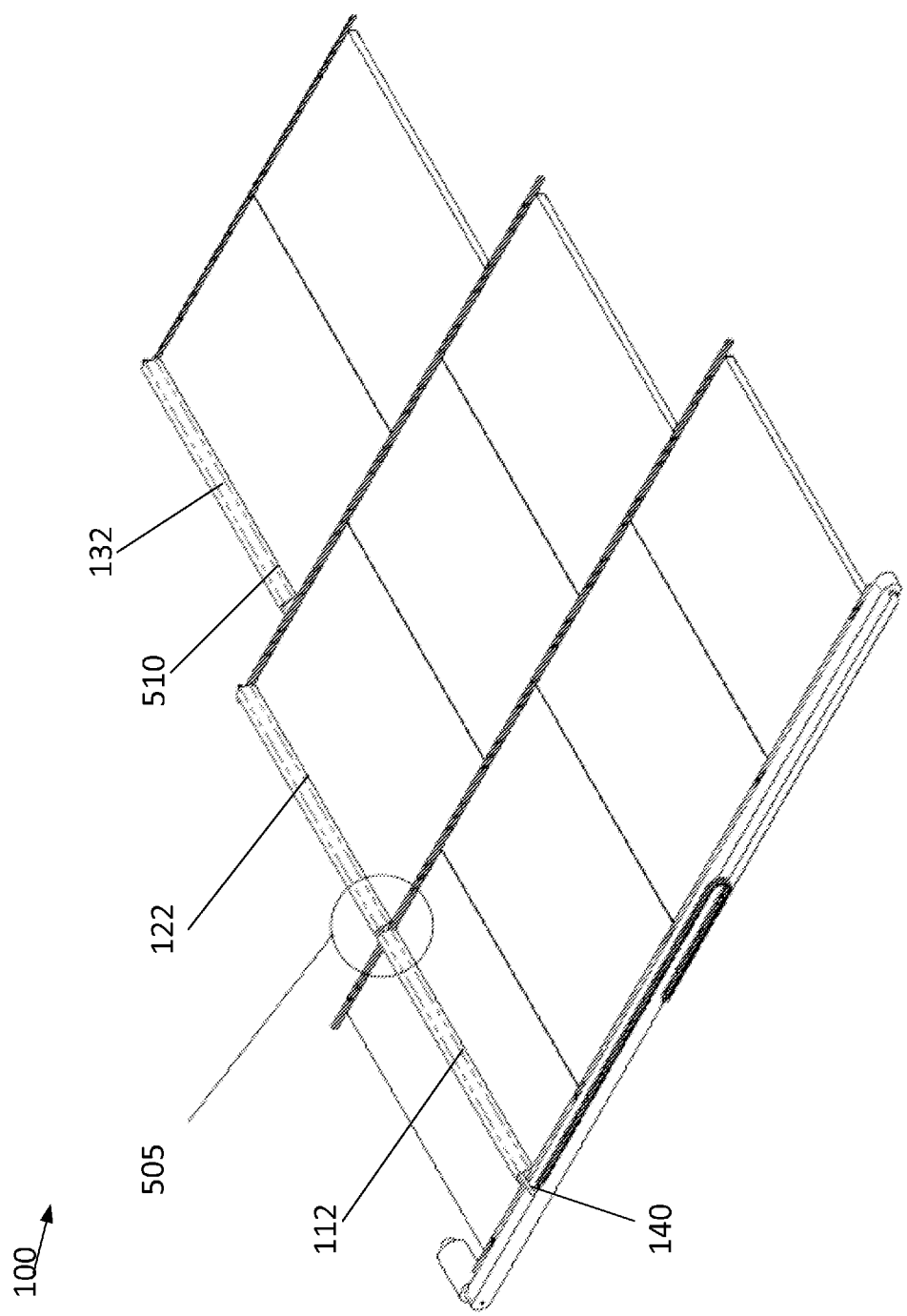
FIG. 5 depicts an embodiment of a washing system, according to an embodiment.

FIG. 5 depicts an embodiment of washing system 100, wherein first washing device 112 remains aligned with second washing device 122, while third washing device 132 is misaligned from first washing device 112 and second washing device 122.

As depicted in FIG. 5, energy chain 140 may move first washing device 112 and second washing device 122 along the linear path to a position past a second end 510 of the third row solar panels. When the third washing device 132 is positioned at the second end 510 of the third row of solar panels, third washing device 132 may be locked, secured, fixed, etc. in place via a locking mechanism.

When third washing device 132 is positioned at the second end 510 of the third row, the actuator coupled with the second connection shaft may move the second connection shaft. The second connection shaft may be moved to no longer be inserted within the third water feed tube.

However, when the second connection shaft is no longer inserted into within the third water feed tube, the first connection shaft 505 may still be utilized to couple first washing device 112 and second washing device 122. Accordingly, via the actuator, the second connection shaft may be configured to automatically couple and decouple washing devices based on the alignment and misalignment of the washing devices.

Additionally, when the second connection shaft is moved from the third water feed tube, a water seal positioned at the end of second water feed tube may block the flow of the fluid out of the second water deed tube. Accordingly, the water seal positioned at the end of second water feed tube may be configured to stop the flow of fluid out of the second connection shaft when the second connection shaft is not inserted within the third water feed tube.

Figure 6:
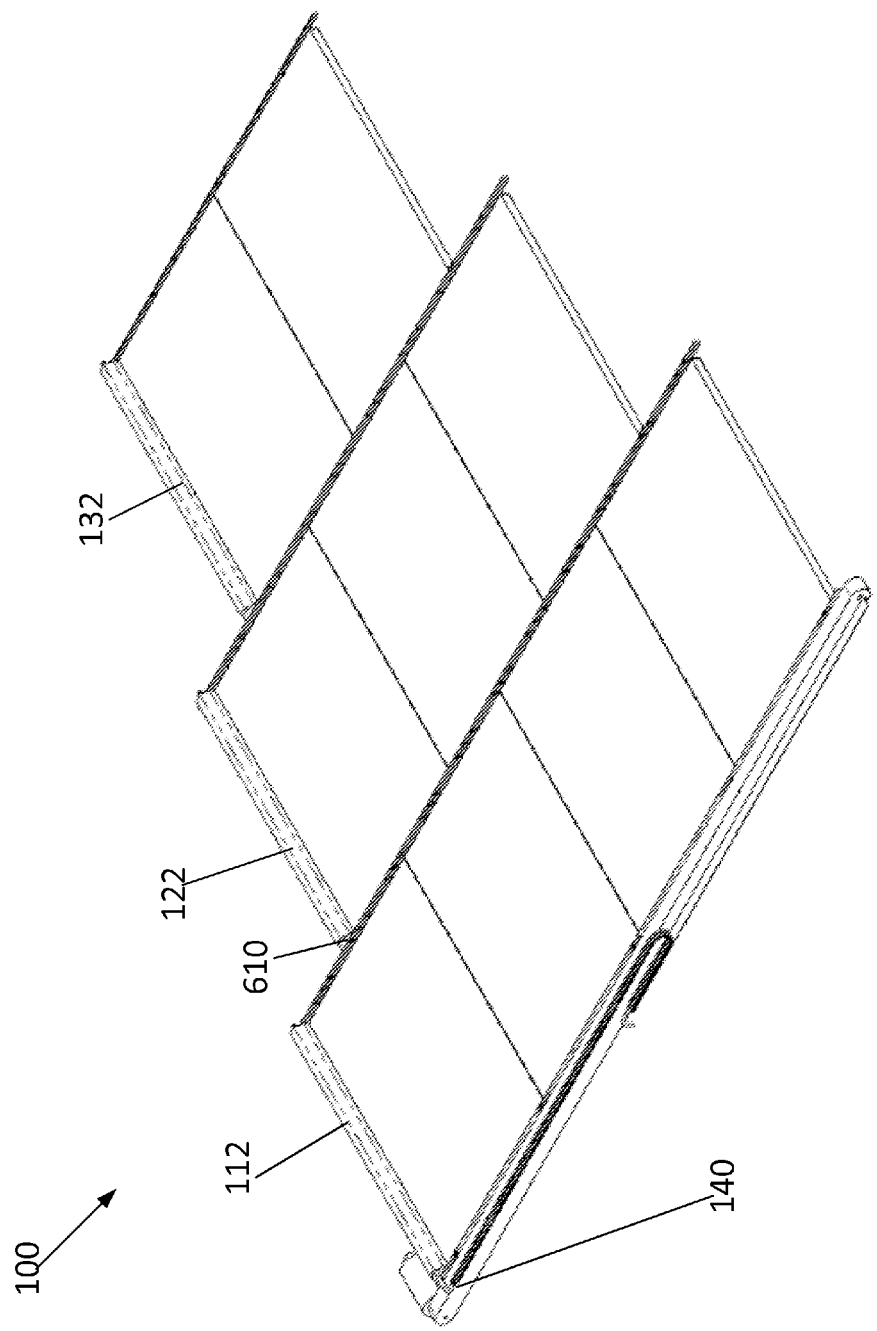
FIG. 6 depicts an embodiment of a washing system, according to an embodiment.

FIG. 6 depicts an embodiment of washing system 100, wherein first washing device 112 is misaligned from second washing device 122 and third washing device 132.

As depicted in FIG. 6, energy chain 140 may move first washing device 112 along the linear path to a position past a second end 610 of the second row solar panels. When second washing device 122 is positioned at the second end 610 of the second row of solar panels, second washing device 122 may be locked, secured, fixed, etc. in place via a locking mechanism.

Furthermore, when second washing device 122 is positioned at the second end 610 of the second row, the actuator coupled with the first connection shaft may move the first connection shaft. The first connection shaft may be moved to no longer be inserted within the third water feed tube, wherein a portion of the first connection shaft may remain within the first water feed tube.

Additionally, when the first connection shaft is moved from the second water feed tube, a water seal may block the flow of the fluid out of the first connection shaft. Accordingly, the water seal may be configured to stop the flow of fluid into the first connection shaft when the first connection shaft is not inserted within the second water feed tube.

Figure 7:
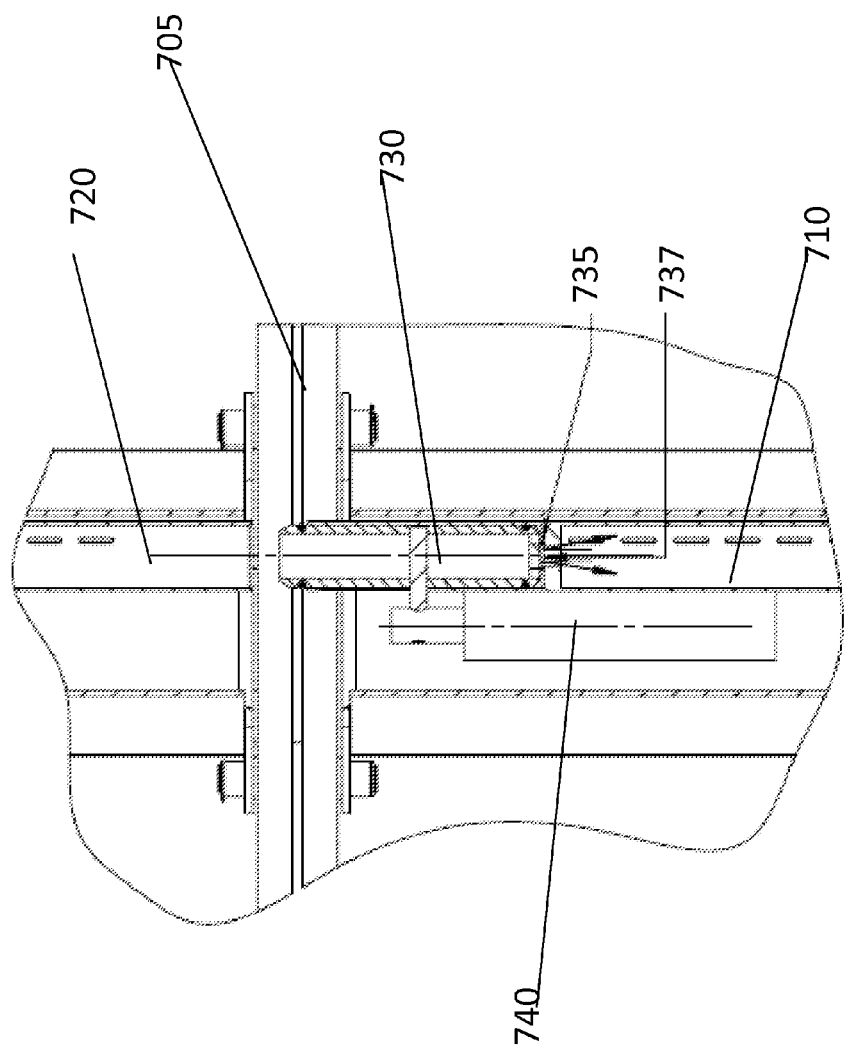
FIG. 7 depicts one embodiment of a first water feed tube, according to an embodiment.

FIG. 7 depicts one embodiment of a top view of first water feed tube 710, a second water feed tube 720, and a connection shaft 730, wherein connection shaft 730 in a first position.

Connection shaft 730 may be a hollow tube configured to transport fluids across the body of connection shaft 730. Connection shaft 730 is configured to couple first water feed tube 710 and second water feed tube 720 across a rail 705. As depicted in FIG. 7, first water feed tube 710 and second water feed tube 720 may have substantially the same diameter, wherein connection shaft 730 may be inserted. Furthermore, first water feed tube 710 and second water feed tube are configured to align with each other to form a continuous shaft, and misalign with each other to form independent shafts.

In a first position, first water feed tube 710 and second water feed tube 720 may not be coupled together via connection shaft 730. First water feed tube 710 and second water feed tube 720 may not be coupled together, because respective washing devices may not be aligned, and/or actuator 740 has not moved connection shaft 730 to be inserted into second water feed tube 720.

Water seal 735 may be positioned on a second end of first water feed tube 710, and water seal 735 may be a flexible membrane that seals and isolates an enclosure in a first position. In a second position, water seal 735 may allow fluid to travel across the flexible membrane. In the first position water seal 735 may limit, reduce, block, or prevent fluid from flowing into a body of connection shaft 730 and second water feed tube 720. In the first position, a first end 737 of connection shaft 730 may be positioned adjacent to water seal 735, which may assist water seal 737 from transporting water into connection shaft 730.

Actuator 740 may be a motor that is configured to move connection shaft 730 between the first position and the second position. Actuator 740 may be coupled to a processor, mechanical system, electronic system, systems, etc. to move connection shaft 730 between the first position and the second position. Responsive to actuator 740 moving first end 737 of connection shaft 730, first end 737 may not be positioned adjacent to water seal 735. When first end 737 is not positioned adjacent to water seal 735, fluid may not flow through water seal 735.

Figure 8:
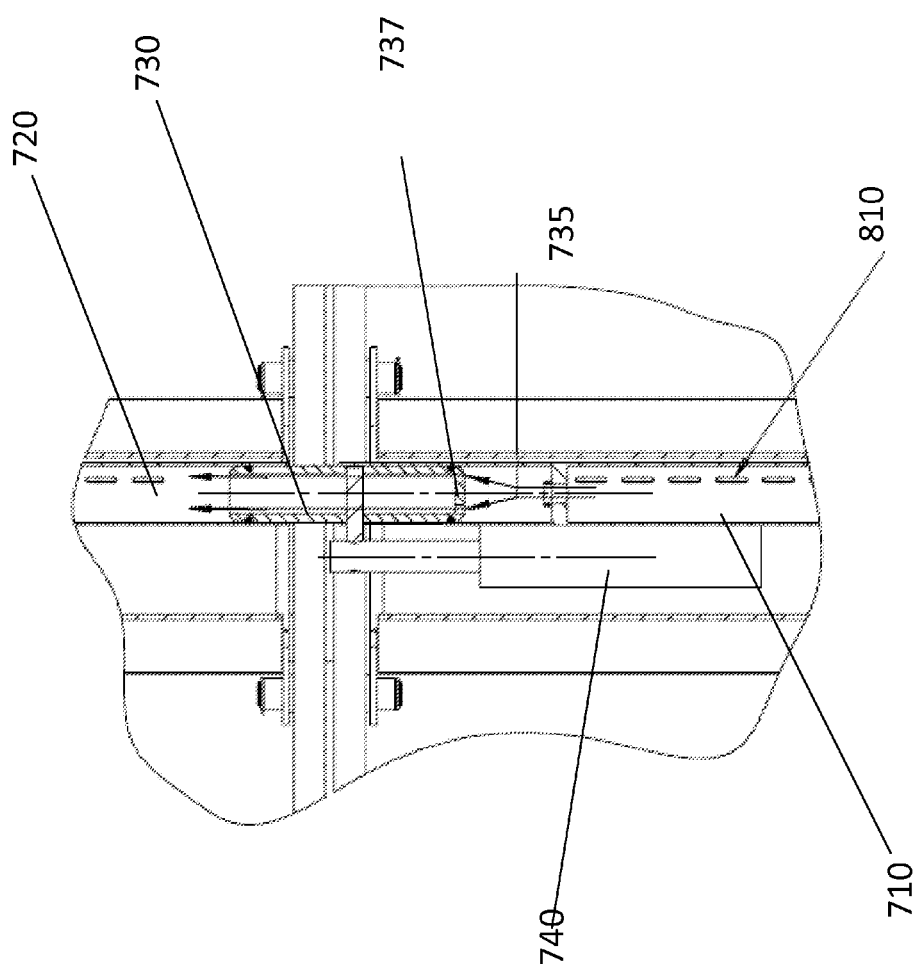
FIG. 8 depicts one embodiment of a connection shaft in the second position, according to an embodiment.

FIG. 8 depicts one embodiment of connection shaft 730 in the second position. As depicted in FIG. 8, actuator 740 may have moved connection shaft 735 from the first position to the second position.

Responsive to actuator 740 moving connection shaft 730 into the second position, at least a portion of connection shaft 730 may be positioned within first water feed tube 710 and another portion of connection shaft 730 may be positioned within second water feed tube 720. Accordingly, a proximal end of connection shaft 730 may be positioned within first water feed tube 710, while a distal end of connection shaft 730 may be positioned within second water feed tube 720, wherein a center of connection 730 is positioned over the rail between the rows of solar panels.

When actuator 740 moves connection shaft 730, water seal 735 may be positioned away from the first end of connection shaft 730. Thus, water seal 735 may allow fluid to enter connection shaft 730. The water may travel out of the second end of connection shaft 730 into second water feed tube 720. Accordingly, actuator 740 may be configured to dynamically couple first water feed tube 710 and second feed tube 720 via movement of connection shaft 730.

In embodiments, actuator 740 may couple and decouple the feed tubes based on the positioning of a first washing device associated with first water feed tube 710 and the positioning of a second washing device associated with second water feed tube 720. Responsive to a processor determining that first feed tube 710 is aligned with second water feed tube 720 and a locking mechanism associated with the second washing device is securing the second washing device in place, the actuator may move the connection shaft 730 to couple the water feed tubes.

Furthermore, as depicted in FIG. 8, each of the feed tubes may include orifices 810. Orifices 810 may be configured to allow fluid disposed within the feed tubes to percolate on the solar panels below and in front of the washing devices.

Figure 9:
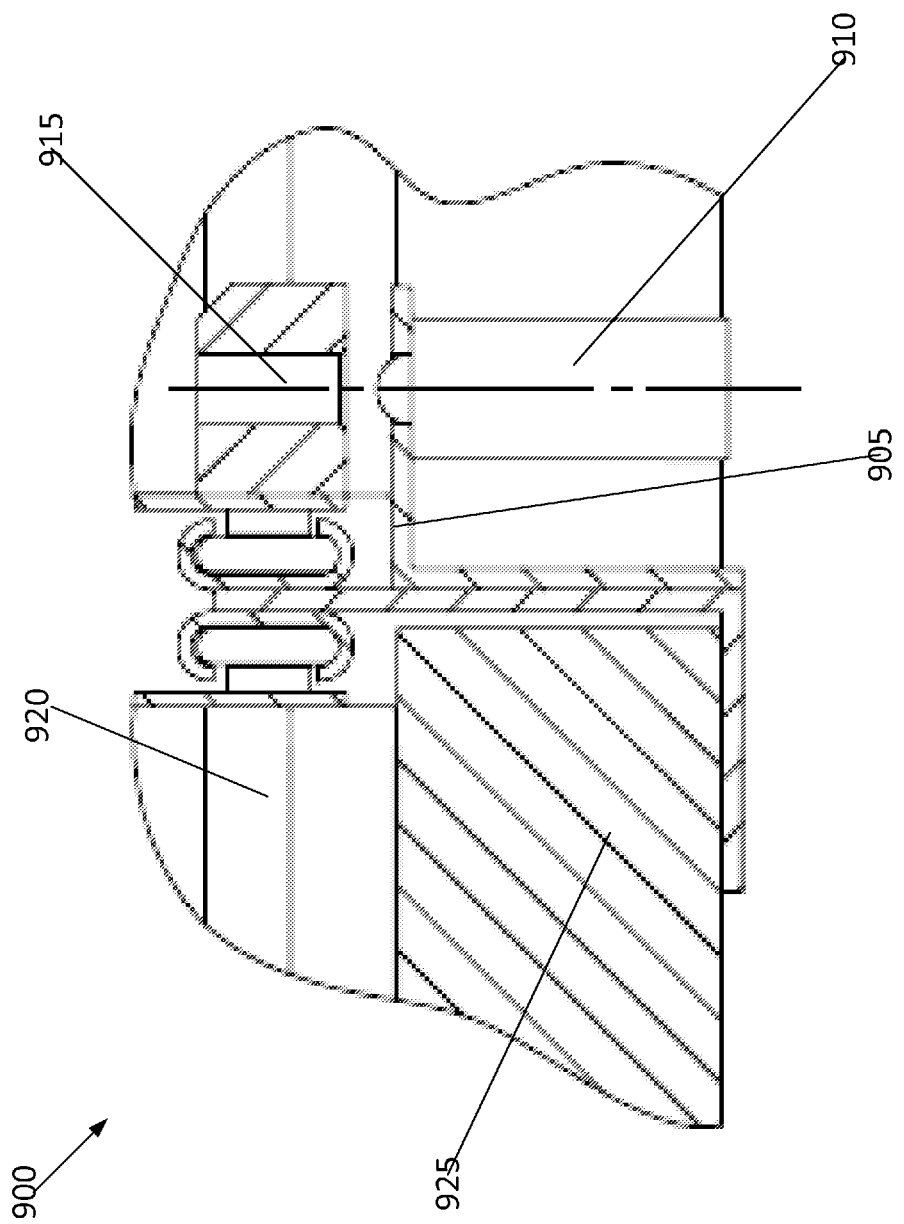
FIG. 9 depicts one embodiment of a locking mechanism in a first position, according to an embodiment.

FIG. 9 depicts one embodiment of a side view of locking mechanism 900 in a first position, wherein locking mechanism 900 is not engaged. Locking mechanism 900 may be configured to secure a washing device 920 in place. In embodiments, locking mechanisms 900 may include a locking pin 910 and lock receiver 915. Locking pin 910 may be positioned on rail 905, and locking receiver 915 may be positioned on a washing device 920.

In the first position, locking pin 910 may be in a retracted position. When locking pin 910 is retracted, then an upper surface of locking pin 910 may be positioned flush with a lower surface of rail 905. Therefore, in the retracted position, locking pin 910 may not extend into washing device 920. Because locking pin 910 is not interfaced within washing device 920 in the first position, washing device 920 may move along a linear path to clean solar panel 925. In embodiments, locking pin 910 may be configured to move vertically in a direction that is perpendicular to the movement of washing device 920.

Figure 10:
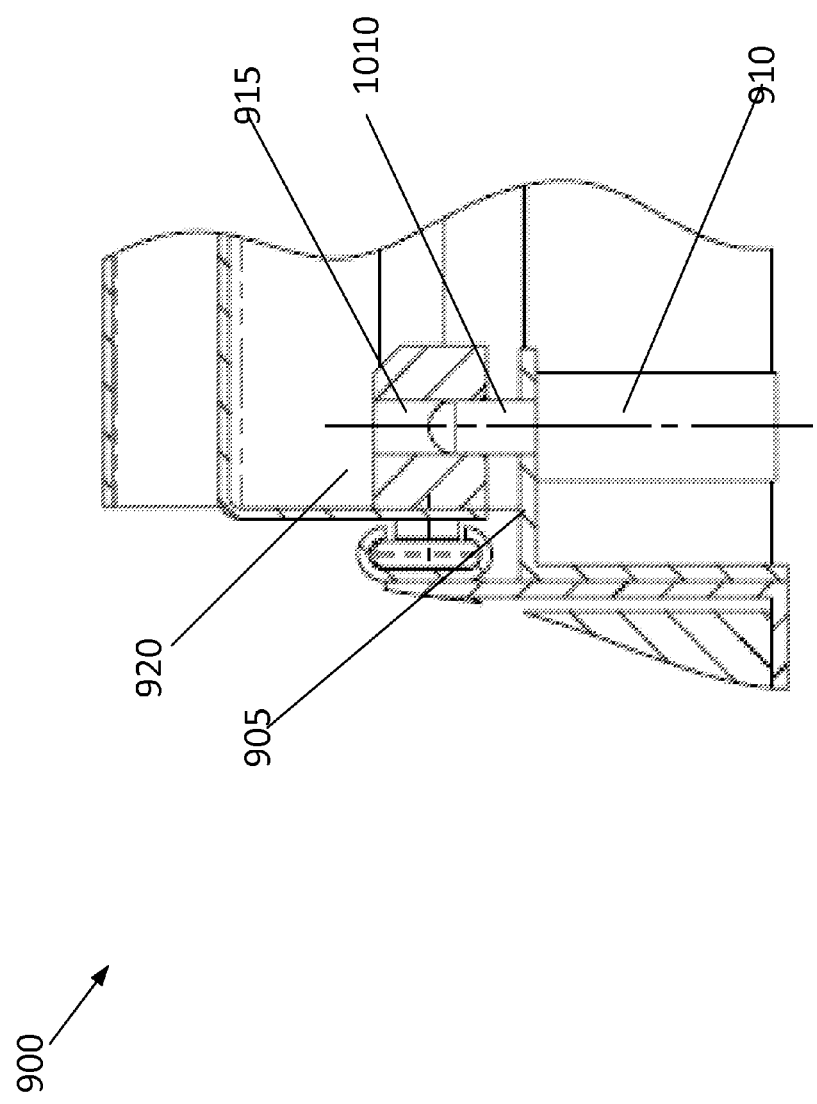
FIG. 10 depicts one embodiment of a locking mechanism in a second position, according to an embodiment.

FIG. 10 depicts one embodiment of a locking mechanism 900 in a second position. In the second position, a tip 1010 of locking pin 910 may be extended into lock receiver 915. When tip 1010 of locking pin 910 is positioned within lock receiver 915, washing device 920 may be secured in place, wherein washing device 920 may not move along rail 905.

In embodiments, tip 1010 of locking pin 910 may be spring loaded. When washing device 920 is positioned at an end of a row of solar panels, the spring loaded tip 1010 may be inserted into the lock receiver 915. Responsive to a processor determining that washing device 920 is aligned with another washing device, the processor may move an actuator to retract the spring.

Figure 11:
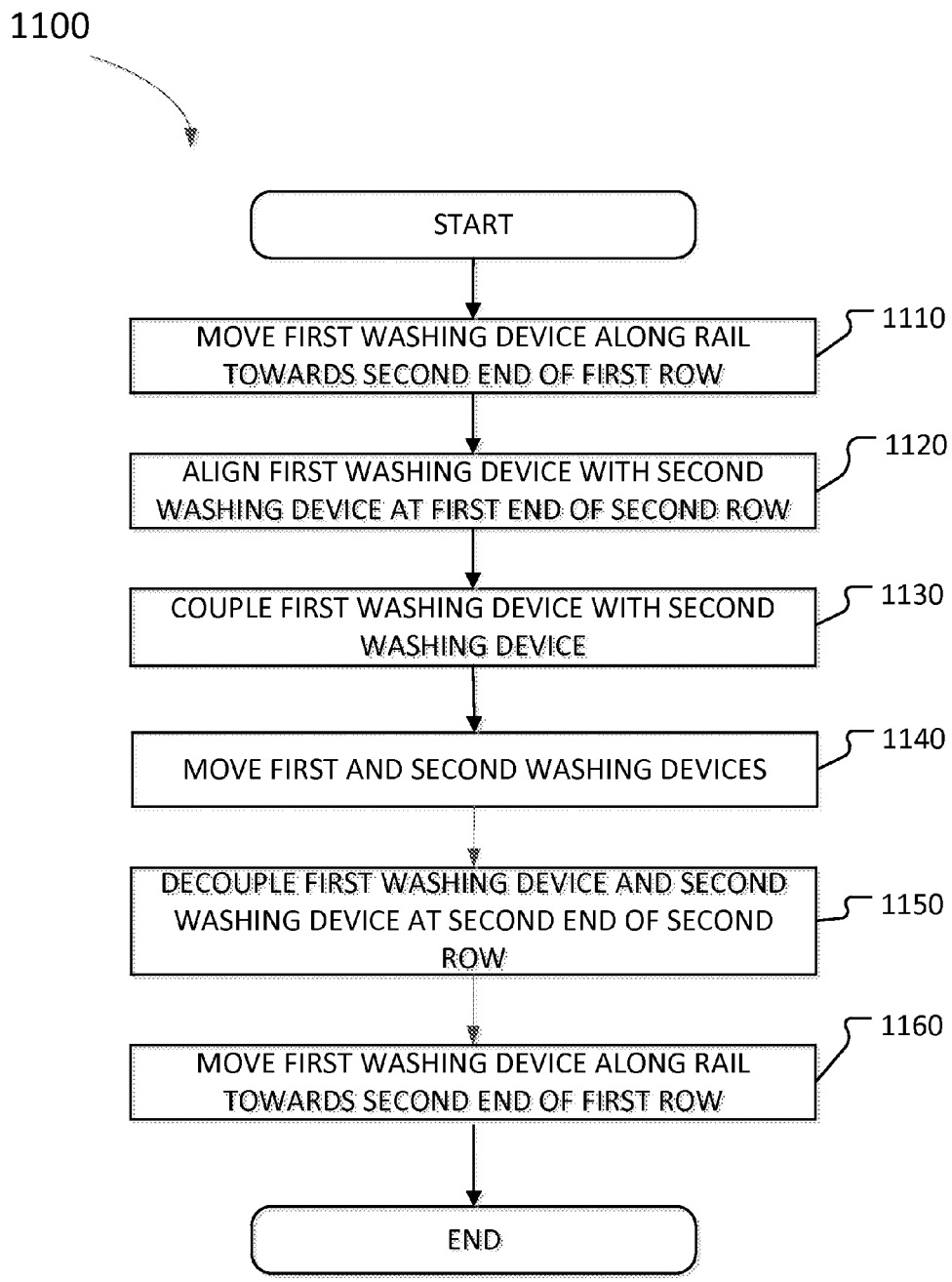
FIG. 11 depicts a method for utilizing a dynamic solar panel cleaning system, according to an embodiment.

FIG. 11 depicts a method 1100 for a dynamic solar panel cleaning system.

The operations of method 1100 presented below are intended to be illustrative. In some embodiments, method 1100 may be accomplished with one or more additional operations not described, and/or without one or more of the operations discussed. Additionally, the order in which the operations of method 1100 are illustrated in FIG. 11 and described below is not intended to be limiting.

At operation 1110, a first washing device may move along a first row of solar panels. The first washing device may move from a first end of the first row of solar panels towards the second end of the first row of solar panels. The first row of solar panels may be the longest row of solar panels, and may be positioned adjacent to a second row of solar panels.

At operation 1120, the first washing device may be aligned with a second washing device, wherein the second washing device is positioned at a first end of the second row. The first end of the second row may be positioned proximate to a first end of the first row of solar panels. When the first washing device becomes aligned with the second washing device, the second washing device may be secured in place via a locking mechanism.

At operation 1130, an actuator may be moved to move a connection shaft. Responsive to the connection shaft being moved, a first water feed tube associated with the first washing device may be directly coupled to a second water feed tube associated with the second washing device via the connection shaft. Responsive to the connection shaft coupling the first water feed tube and the second water feed tube, the locking mechanism may be released so the second washing device may be moved.

At operation 1140, the first washing device and the second washing device may be moved in a linear direction, wherein the linear direction is from the first end of the second row of solar panels towards the second end of the second row of solar panels. While the first washing device and the second washing device are coupled, the first washing device and the second washing device may dispense fluid that is received from the same fluid source.

At operation 1150, the second washing device may be positioned adjacent to the second end of the second row of solar panels. Responsive to the second washing device being positioned adjacent to the second end of the second row, a locking mechanism may secure the second washing device in place. When the second washing device is secured in place, the actuator may move the connection shaft such that no portion of the connection shaft is positioned within the second water feed tube. Accordingly, by moving the connection shaft outside of the second water feed tube, the first washing device and the second washing device may be decoupled. Responsive to the first washing device and the second washing device being decoupled, fluid from the first water feed tube may not enter the second water feed tube. Therefore, the washing system may conserve water by utilizing a single fluid source, and only dispensing the required amount of fluid onto the solar panels.

At operation 1150, the first washing device may continue to move along the first row of solar panels, wherein the first washing device may move in the direction from the first end of the first row of solar panels towards the second end of the first row of solar panels. The first washing device may move while being decoupled from the second washing device.

Accordingly, a single energy train may move a plurality of washing devices only when the washing devices are aligned. Therefore, panels that are arranged in different layouts may be cleaned at the same time utilizing the same energy train and fluid source, wherein the energy train is configured to move washing devices in a direction that is perpendicular to fluid lines Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s).

What is claimed is:

1. A system for cleaning solar panels comprising:
   an energy chain configured to move in a linear path;
   a plurality of rows of solar panels, wherein each row of solar panels includes a different number of solar panels, the plurality of rows including a first row and a second row, wherein the first row extends past the second row;
   a first washing device configured to couple with the energy chain to clean the solar panels associated with the first row, the first washing device including a first water feed tube extending across a width of the first row;
   a second washing device configured to couple with the first washing device to clean the solar panels associated with the second row, the second washing device including a second water feed tube extending across a width of the first second row, wherein the first water feed tube and the second water feed tube have a first diameter;
   a rail configured to be positioned between the first row and the second row;
   a connection shaft having a first end and a second end, the first end of the connection shaft being fixedly positioned within the first water feed tube and the second end of the connection shaft being removably positioned within the second water feed tube, wherein the second end of the connection feed tube is configured to be inserted into the second water feed tube when the first water feed tube is aligned with the second water feed tube, the first washing device and the second washing device being aligned when the first washing device is positioned at a location along the linear path having solar panels on the first row and the second row.

2. The system of claim 1, further comprising:
   a locking mechanism configured to engage the second washing device to secure the second washing device at a proximal end of the second row when the first washing device and the second washing device are misaligned, the first washing device and the second washing device being misaligned when the first washing device is positioned at a location along the linear path not having solar panels the second row.

3. The system of claim 2, wherein the locking mechanism is configured to disengage to allow the second washing device to move along with the first washing device when the first washing device and the second washing device are aligned.

4. The system of claim 3, wherein the locking mechanism is configured to automatically disengage when the second end of the connection feed tube is configured to be inserted into the second water feed tube.

5. The system of claim 1, comprising:
   a fluid hose having an inlet coupled to an external fluid source and an outlet port coupled with the first washing device, wherein the fluid hose is configured to deliver fluid to the first washing device and the second washing device when the first washing device and the second washing device are aligned and only the first washing device when the first washing device and the second washing device are misaligned.

6. The system of claim 1, comprising:
a seal positioned proximate to a distal end of the first water feed tube and adjacent to the first end of the connection shaft when the first washing device and the second washing device are misaligned.

7. The system of claim 6, wherein the first end of the connection shaft is offset from the seal when the first washing device and the second washing device are aligned.

8. The system of claim 7, wherein the seal is configured to block the flow of fluid into the connection shaft when the first washing device and the second washing device are misaligned.

9. The system of claim 1, wherein when aligned the first water feed tube and second water feed tube form a continuous shaft, the continuous shaft being longer than the first water feed tube.

10. The system of claim 1, wherein the first washing device and the second washing device are configured to be coupled with each other when aligned, and are the first washing device and the second washing device are configured to be decoupled from each other when misaligned.

11. The system of claim 10, wherein when the first washing device and the second washing device are aligned, the first washing device and the second washing device move dependently based on the energy chain.

12. The system of claim 1, wherein movement of the second washing device is based on the movement of the first washing device.

13. The system of claim 12, wherein the second washing device cannot move when the first washing device and second washing device are misaligned.

14. The system of claim 12, wherein the first washing device can move when the first washing device and the second washing device are misaligned.

15. The system of claim 1, comprising:
an actuator configured to move the connection shaft in a direction perpendicular to the linear path.

16. The system of claim 1, wherein the first water feed tube and the second water feed tube are vertically offset from a surface of the solar panels.

17. The system of claim 1, wherein all of the fluid delivered to the second fluid feed tube passes through the first water feed tube.

18. The system of claim 1, wherein when the first washing device and second washing device are coupled together the first washing device and second washing device form a unified washing device.

19. The system of claim 1, wherein when the second washing device is located at a proximal end and a distal end of the second row, the second end of the connection shaft will be removed from the second water feed tube.

20. The system of claim 19, wherein the first washing device will couple with the second washing device at the proximal end and the distal end of the second row.

* * * * *

UNITED STATES PATENT AND TRADEMARK OFFICE
CERTIFICATE OF CORRECTION

PATENT NO. : 9,276,523 B1
APPLICATION NO. : 14/692222
DATED : March 1, 2016
INVENTOR(S) : Cory Berendzen Page 1 of 1

It is certified that error appears in the above-identified patent and that said Letters Patent is hereby corrected as shown below:

Title page, item (12), delete "Berendez" and insert -- Berendzen --.

Title Page, Item (71) Applicant is corrected to read:
-- Cory Berendzen, Austin (TX) --.

Title Page, Item (72) Inventor is corrected to read:
-- Cory Berendzen, Austin (TX) --.

Signed and Sealed this
Seventh Day of June, 2016

Michelle K. Lee
*Director of the United States Patent and Trademark Office*